(12) United States Patent
Erdmann et al.

(10) Patent No.: US 7,688,084 B2
(45) Date of Patent: Mar. 30, 2010

(54) TESTING APPARATUS AND METHOD FOR DETECTING A CONTACT DEFICIENCY OF AN ELECTRICALLY CONDUCTIVE CONNECTION

(75) Inventors: Wolfgang Erdmann, Buxtehude (DE); Eckehard Zuendorf, Neunkirchen-Seelscheid (DE)

(73) Assignee: Airbus Deustschland GmbH (DE)

( * ) Notice: Subject to any disclaimer, the term of this patent is extended or adjusted under 35 U.S.C. 154(b) by 0 days.

(21) Appl. No.: 12/308,159

(22) PCT Filed: Jun. 2, 2006

(86) PCT No.: PCT/EP2006/005282
§ 371 (c)(1),
(2), (4) Date: Dec. 2, 2008

(87) PCT Pub. No.: WO2007/140795
PCT Pub. Date: Dec. 13, 2007

(65) Prior Publication Data
US 2009/0167331 A1 Jul. 2, 2009

(51) Int. Cl.
*G01R 31/302* (2006.01)
(52) U.S. Cl. .................................... 324/750
(58) Field of Classification Search ................. 324/754, 324/760, 750, 765, 761–762, 158.1; 257/48; 438/14–18; 250/341.6, 334, 338.1, 338.3
See application file for complete search history.

(56) References Cited
U.S. PATENT DOCUMENTS
4,647,220 A    3/1987   Adams et al.
(Continued)

FOREIGN PATENT DOCUMENTS
DE    100 25 166 A1    3/2002
(Continued)

OTHER PUBLICATIONS

Wenzel et al, "Thermal Energy Emission Diagnostics Enhancement to the Advanced Power Supply Test System", Autotestcon '98, IEEE Systems Readiness Technology Conference, 1998 IEEE Salt Lake City, UT, USA, Aug. 24-27, 1998, New York, NY, USA, IEEE, US, Aug. 24, 1998, pp. 572-579.

*Primary Examiner*—Ha Tran T Nguyen
*Assistant Examiner*—Tung X Nguyen
(74) *Attorney, Agent, or Firm*—Lerner, David, Littenberg, Krumholz & Mentlik, LLP

(57) ABSTRACT

A testing apparatus and a method for detecting a contact deficiency of an electrically conductive connection. The testing apparatus comprises a measuring chamber, in which several system elements of the connection that are connected in an electrically conductive fashion are positioned, a heat radiator that is supplied with energy and the transferred thermal radiation of which is emitted into the measuring chamber and directed toward the region of the system elements that, after having been heated, generate a thermal field of the insulated and the metallic system components of these connected system elements, a thermal (image) acquisition unit for optically capturing the generated thermal field and for realizing a signal conversion into a thermal image of the connected system elements, and a thermal (image) reproduction unit for the visual reproduction of the converted thermal image.

27 Claims, 5 Drawing Sheets

State of the Art

U.S. PATENT DOCUMENTS

| | | | |
|---|---|---|---|
| 4,792,683 A | 12/1988 | Chang et al. | |
| 4,984,902 A * | 1/1991 | Crowley et al. | 374/1 |
| 5,564,830 A * | 10/1996 | Bobel et al. | 374/126 |
| 6,191,599 B1 * | 2/2001 | Stevens | 324/760 |
| 6,387,715 B1 | 5/2002 | Davis et al. | |
| 2004/0004482 A1 | 1/2004 | Bouabdo et al. | |

FOREIGN PATENT DOCUMENTS

| | | |
|---|---|---|
| DE | 101 03 689 A1 | 8/2002 |
| DE | 102 40 060 A1 | 3/2004 |
| DE | 10 2005 014 072 A1 | 1/2007 |
| EP | 1 315 976 B1 | 6/2003 |
| GB | 2 358 466 A | 7/2001 |

* cited by examiner

State of the Art

State of the Art

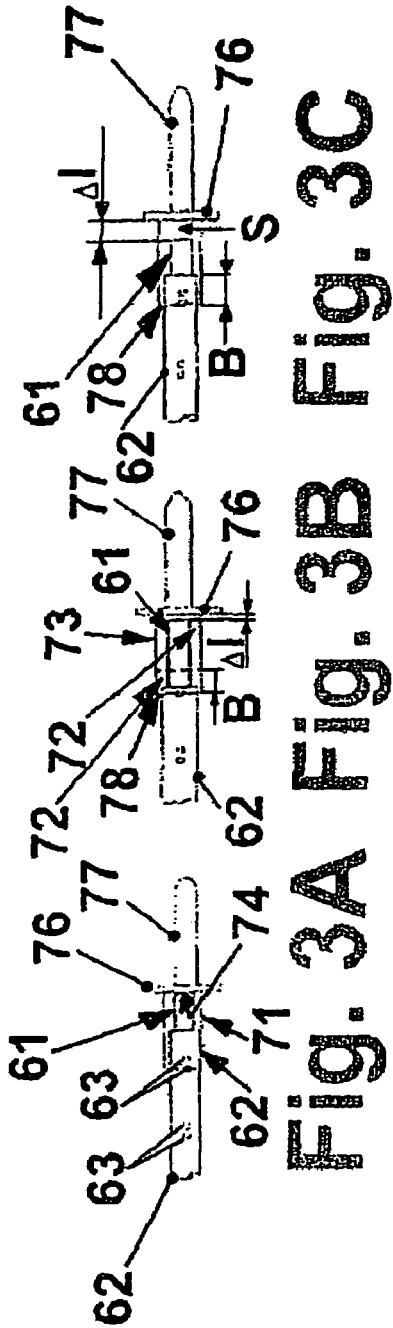
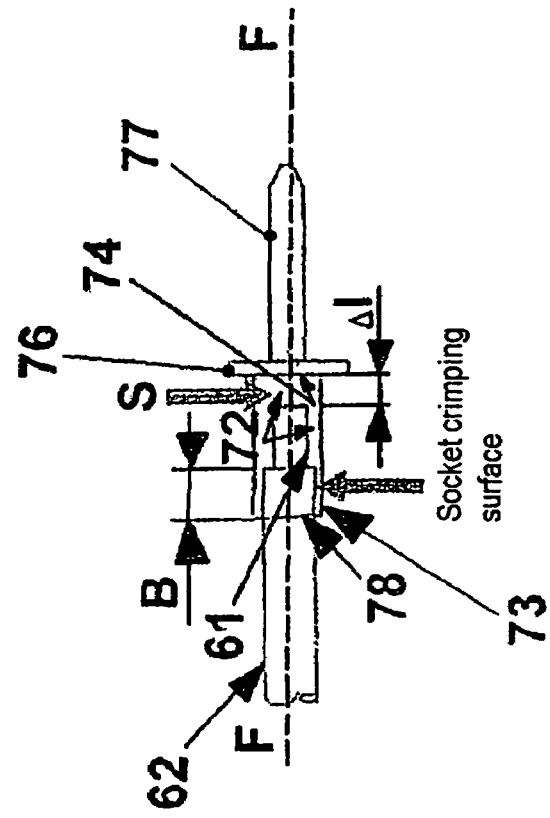

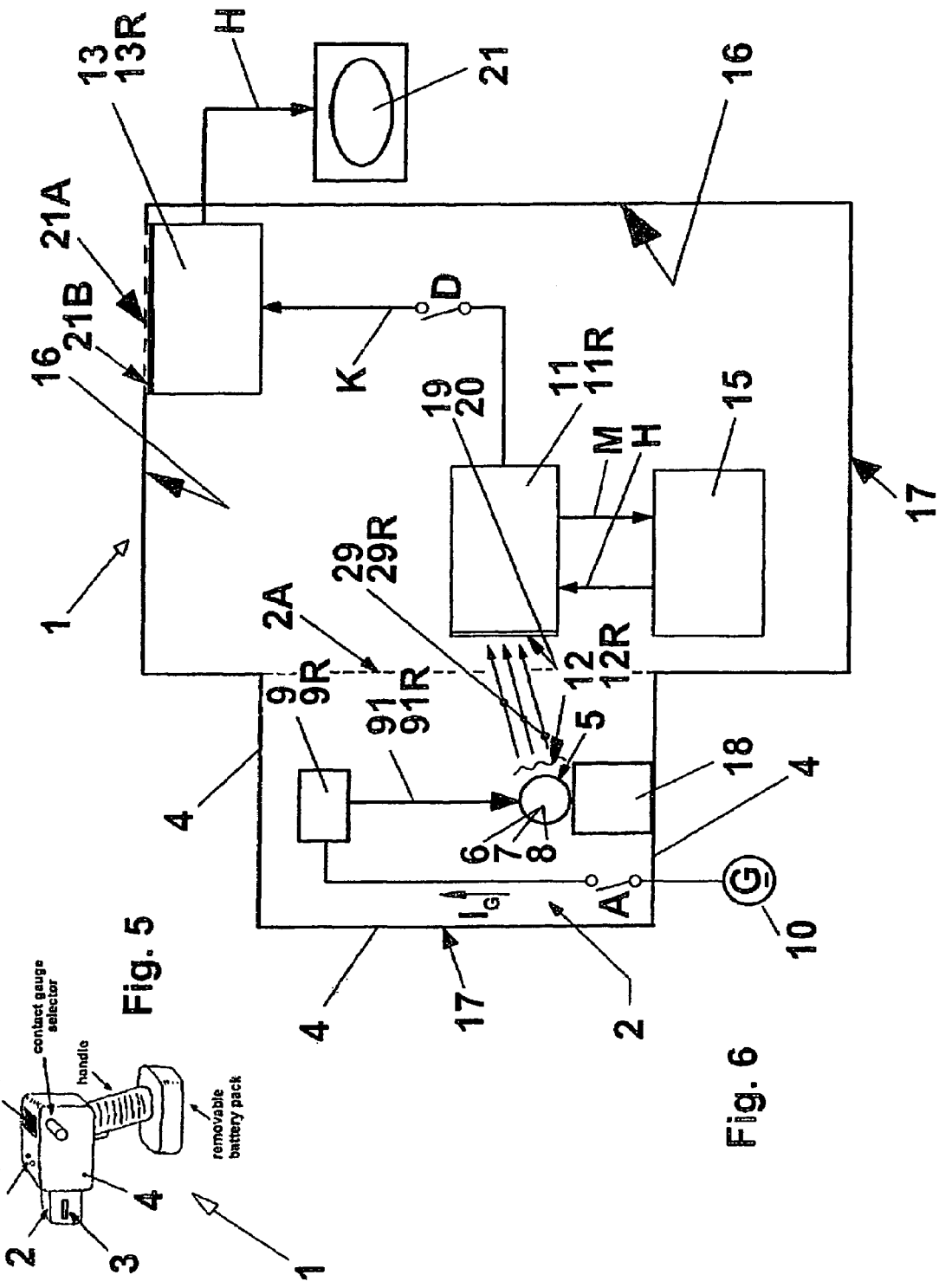

TESTING APPARATUS AND METHOD FOR DETECTING A CONTACT DEFICIENCY OF AN ELECTRICALLY CONDUCTIVE CONNECTION

FIELD OF THE INVENTION

The invention relates to a testing apparatus and a method for detecting a contact deficiency of an electrically conductive connection according to the preambles of claims 1, 2 and 23. It is intended for applications in which such connections need to be produced in a very precise and quality-responsive fashion in order to ensure the constant availability and reliability of the electrically conductive connections in the supply of energy to electric consumers and/or the transmission of information to control units or other devices, for example, in aircraft. The invention realizes a prophylactic testing of such electric cable connections that are prefabricated due to technological considerations and allows a reliable visual detection of incorrectly (defectively) produced cable connections without significantly technological expenditures.

BACKGROUND TO THE INVENTION

It is generally known that vehicles such as land craft, watercraft or aircraft are equipped with a plurality of electric connections that need to be produced in a very precise and quality-responsive fashion for the initially cited reasons. Conventional cable connections, the installation of which is realized with copper cables, are quite frequently produced with copper cables, the conductor of which is respectively connected by crimping a metallic crimp type socket on the stripped conductor region with the aid of a suitable tool, wherein the electric connection between to strip conductor ends accommodated in the sockets is ensured, for example, by the socket making contact with the conductors. This contacting is predominantly realized with said crimp connection, wherein conventional systems may include this installation technology. In order to ensure that a reliable electric connection is produced, crimp type contact sockets provided with a recess in the form of an inspection hole are used, for example, in the construction of aircraft, so as to determine whether or not the copper conductors of two copper cables are correctly connected to one another by means of crimping. In this case, (only) a visual inspection may be carried out after the crimping process so as to ensure that the crimping process was performed properly, wherein the crimped conductor needs to be visible within the region of the inspection hole if the contact socket was properly crimped. Since visual errors of the individual inspectors or material defects on the contact socket or an inspection hole position that deviates from the predefined position (due to the defective manufacture of the contact socket), among other things, may never be ruled out, the question whether this testing technology actually suffices is not discussed in detail because the proposed invention pursues a profoundly different goal. Corresponding examples of such cable connections are illustrated in enclosed FIGS. 1 and 2 in order to provide the observer with a practical overview of the relevant design.

With respect to aircraft, the invention also takes into consideration installations with cables, the conductor material of which may result in a weight reduction, namely because any weight reduction is a desirable aspect, particularly in the construction of aircraft, for example, due to the attainable energy savings (kerosene consumption) and the extended range of the aircraft.

When utilizing a technology of this type that takes into account the installation of such weight-reducing cables in aircraft, it may be necessary to utilize crimpable contact sockets that do not contain an inspection hole. The reason for the lack of the inspection hole may be seen in that the contact areas of the connecting points may need to be hermetically sealed in order to reliably preclude any corrosion of the crimp connection and/or an increase of the electric contact resistances at the contact points. Corrosion may be caused by various types of materials (silver, copper, nickel, aluminum), wherein the reason for this corrosion may be seen in that the connection(s) is (are) produced with (a) cable(s) and a contact socket of different conductive materials, as well as in the local influence of an electrolyte in connection with (occurring) humidity, for example, atmospheric: humidity. In this respect, in conventional systems corroding contact(s) (surfaces) may lead to the failure of the connected devices and apparatuses or even entire systems, wherein this may, in the (undesirable) worst-case scenario, result in the complete failure of the (correlating) systems in the aircraft. The consumption of a corroded, current-carrying contact caused by an increased (growing) electric contact resistance may have fatal consequences. The increase of the contact resistance at the contact points of the electric connection in question may therefore also be influenced by the improper crimping of the contact socket on the conductor regions to be connected. If the contact surface has excessively small dimensions, the current density increases such that said consumption may occur on the contact surfaces. If the contact socket is improperly crimped such that the connecting element(s) (surfaces) are insufficiently contacted, it may be expected that any occurring vibrations, for example, those of an aircraft, will result in the failure of the devices, apparatuses or the entire system connected with the aid of this crimp connection. The aforementioned inferior contacting in a conductor-crimp type socket-conductor connection may be decisively influenced by the improper crimping of the contact(s) (surfaces) of the connecting elements and/or by the inadequate insertion of the cable(s) into the contact sockets, wherein in conventional systems these inadequacies are named under the term "contact deficiency" of the electrically conductive connection. The illustrations in enclosed FIGS. 3A, 3B, 3C and 4 show examples of a connection that is produced correctly or incorrectly, wherein a correctly produced connection (correctly stripped) is illustrated in FIG. 3A. The incorrectly produced cable connections shown in FIGS. 3B (over-stripped), 3C and 4 (incorrectly cut and inserted cable) elucidate the existing need (appreciation) to solve (eliminate) the problem defined below.

SUMMARY OF THE INVENTION

Among other thinks, it may be an object of the invention to make available an efficient solution for a testing apparatus and a method for detecting a contact deficiency of an electrically conductive connection, wherein said solution may make it possible to verify whether prefabricated cable connections or subsequently produced cable connections as they are required during repair procedures or adaptive modifications are produced in a precise and quality-responsive fashion. The invention may aim to disclose a reliable visual detection of incorrectly (defectively) produced cable connections, wherein the handling of the testing apparatus and the implementation of the method may be realized without significant technological expenditures.

This objective is attained with the characteristics disclosed in claims 1, 2 and 23. Embodiments of these measures are disclosed in the remaining claims.

According to an exemplary embodiment a testing apparatus for detecting a contact deficiency of an electrically conductive connection is provided wherein the testing apparatus is realized with several electrically conductive system elements for conducting signals or energy, wherein a measuring chamber is provided in which are positioned the system components of the connection that are connected to one another in an electrically conductive fashion, wherein a heat radiator is provided that is supplied with energy and the transferred thermal radiation of which that is emitted into the measuring chamber is directed toward the region of the system elements such that a thermal field of the insulated and the metallic system components of these connected system elements is generated, wherein a thermal (image) acquisition unit is provided that serves for optically capturing the generated thermal field emitted by the heated insulated and metallic system components of these connected system elements and for realizing a signal conversion into a thermal image of the connected system elements, and wherein a thermal (image) reproduction unit is provided that serves for realizing a visual reproduction of the converted thermal image, with the thermal (image) acquisition unit and the thermal (image) reproduction unit being connected in an information technological manner.

According to an exemplary embodiment a testing apparatus for detecting a contact deficiency of an electrically conductive connection is provided wherein the testing apparatus is realized with several electrically conductive system elements for conducting signals or energy, wherein a measuring chamber is provided in which are positioned the system components of the connection that are connected to one another in an electrically conductive fashion, wherein a heat radiator for infrared light is provided that is supplied with a constant current by a generator, wherein the infrared light thermal radiation of said heat radiator that is transferred transversely or horizontally or vertically or in a deflected fashion is directed toward the region of the electrically conductive connection such that a thermal field of the insulated and metallic system components of these connected system elements is generated by the infrared light thermal radiation, wherein a thermal (image) acquisition unit for infrared light is provided that serves for optically capturing the generated thermal field and for realizing a signal conversion into an infrared light thermal image of the conductively connected system elements emitted by the heated insulated and metallic system components of these connected system elements, and wherein a thermal (image) reproduction unit for infrared light is provided that serves for realizing a visual reproduction of a digitally converged thermal image, with the thermal (image) acquisition unit and the thermal (image) reproduction unit being connected in an information technological manner.

According to an exemplary embodiment a method for detecting a contact deficiency of an electrically conductive connection is provided that serves for the testing of the electrically conductive system elements used for conducting signals or energy, wherein several serially connected system elements are connected in an electrically conductive fashion by means of a crimp connection at the connecting points of the system elements, wherein said method utilizes a testing apparatus, the functional scope of which comprises a measuring chamber, a heat radiator that is supplied with energy and arranged within the latter, a thermal (image) acquisition unit and a thermal (image) reproduction unit that are connected with respect to information technology, and wherein the following steps are carried out:

a) the system elements that are serially connected by crimp connections are positioned in the measuring chamber and subsequently
b) the heat radiator in the measuring chamber directs transferred thermal radiation toward the region of the system elements, namely such that subsequently
c) the insulated and metallic system components of the connected system elements absorbs the transferred thermal energy of the thermal radiation converting to a thermal field and subsequently
d) the thermal (image) acquisition unit optically captures and subsequently converts the generated thermal field by a signal conversion into a thermal image and subsequently
e) the thermal (image) production unit realizes a visual reproduction of the converted thermal image.

At this point it has to be mentioned that the described testing apparatus may also be realized by means of further embodiments. Thereby, it is clear for a person skilled in the art that the features described with these further embodiments may also be combined with features of the embodiments described above and the embodiments for the method for detecting a contact deficiency of an electrically conductive connection.

BRIEF DESCRIPTION OF THE DRAWINGS

Below, for further explanation and for better understanding of the present invention, exemplary embodiments are described in more detail with reference to the enclosed drawings. In the drawings:

FIG. 3A, shows a correctly produced cable connection according to FIG. 1 with a conductor insulation of an electric conductor that is accommodated at the beginning of the socket;

FIG. 3B, shows a cable connection according to FIG. 3A with several contact deficiencies;

FIG. 3C, shows a different illustration of the cable connection according to FIG. 3B;

FIG. 4, shows a detailed illustration of the cable connection according to FIG. 3C;

FIG. 5, shows a physical illustration of a testing apparatus for testing cable connections;

FIG. 6, shows the block diagram of the testing apparatus according to FIG. 5;

DETAILED DESCRIPTION OF EXEMPLARY EMBODIMENTS

Figure 1:
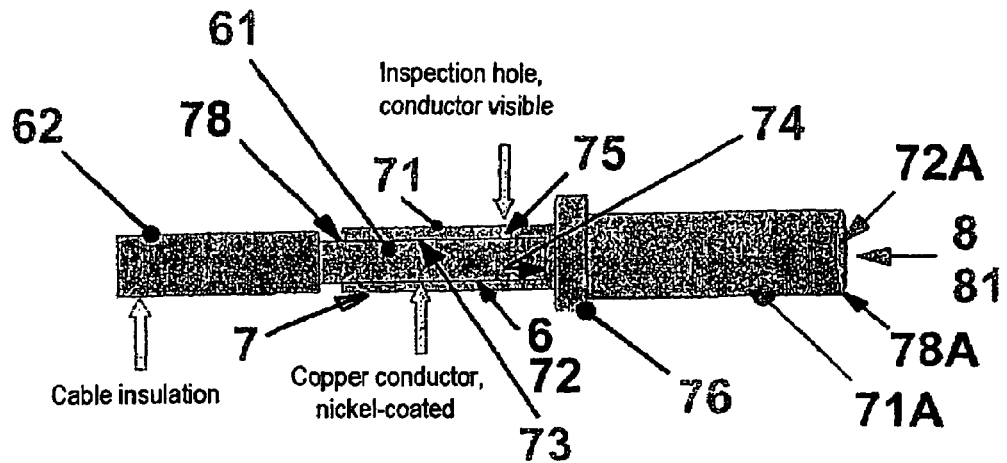
FIG. 1, shows a cable connection with a copper conductor and a contact socket.
Figure 2:
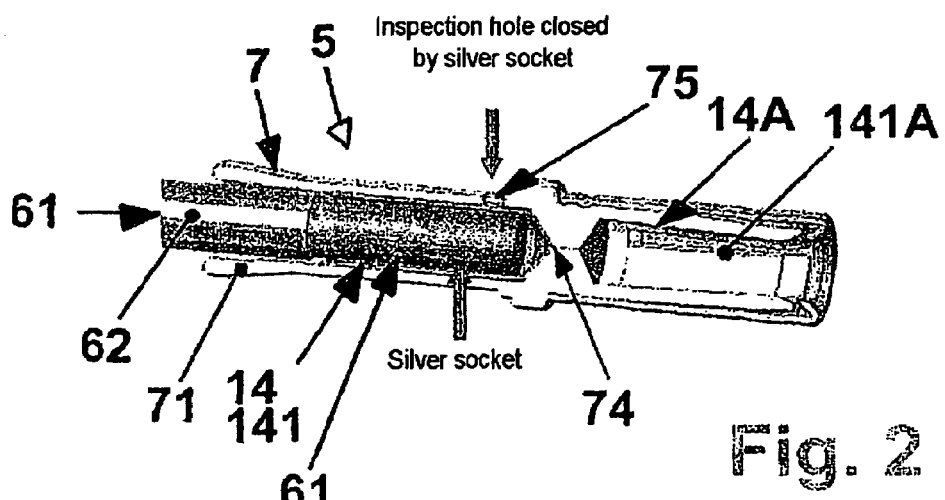
FIG. 2, shows the cable connection according to FIG. 1 with an aluminum conductor (with a copper and/or nickel coating of the bunched wires of the aluminum conductor) that is accommodated within a silver socket.

It should also be noted that the contact socket 71 in FIGS. 1 and 2 is respectively equipped with an inspection hole 75 that traditionally serves for visually inspecting (verifying) an electrically conductive connection 5 in the socket. In other respects, these conductor connections according to FIGS. 1-4 generally pertain to the (conventionally implemented) state of the art while the testing of these conductor connections that is described below and carried out by means of the testing apparatus 1 according to FIGS. 5-8 may aim to eliminate the deficiencies that are (obviously) inherent to traditionally utilized test technologies (in need of improvement) according to FIGS. 1-4 (for testing such conductor connections). In order to clearly elucidate the problems inherent to this state of the art to a person skilled in the art, a few additional explanations deemed necessary for the better understanding of the following exemplary embodiments of the invention are provided below with reference to FIGS. 1-4.

In conventional systems conventional conductor connection according to FIG. 1 may be known. This connection features a contact socket 71, the socket cavity 72 of which on the left side (clearly highlighted) is partitioned approximately in the center of the socket. Consequently, the thusly partitioned socket region (socket cavity 72) may be compared with a socket outlet 74 that is closed in the center of the socket and at which the contact socket 71 (shown on the left) ends (approximately above a socket flange 76 on the circumference of the socket), wherein the right sleeve-shaped socket region of the socket according to FIG. 1 embodies another contact socket 71A for producing another electrically conductive connection.

In the sleeve-shaped socket regions of the socket that lie to the left and/or the right of the socket flange 76 or at the opposite socket inlets 78, 78A, respectively, it may therefore be possible to insert the stripped conductor region of a conductor 61 that is referred to as the first system element 6 and/or a conductor 81 that is referred to as the third system element 8 into the respective socket cavity 72, 72A and to guide this (stripped) conductor region along the socket axis (of the entire socket) as far as the end of the contact socket 71 that is closed in the center of the socket or the socket outlet 74, respectively (such that it is contacted by the conductor end). According to the example shown in FIG. 1, an electric conductor 61 that is realized in the form of a nickel-coated copper conductor and referred to as the first system element 6 should only be connected to one side of the contact socket 75 that is referred to as the second system element 7.

The conductor insulation of the copper conductor may conventionally not be inserted into the socket cavity. A more detailed description of (other) distinguishing peculiarities of cable installations is provided further below.

The electrically conductive connection according to FIG. 1 produced by crimping the contact socket 71 on the conductor end region accommodated in the socket with a suitable crimping tool may be accepted by a person skilled in the art as a correctly produced "conductor-socket connection" or a flawlessly produced "electrically conductive connection 5." A glance into the inspection hole 75 provided on the contact socket 71 enables the inspector to visually inspect each copper conductor and therefore makes it possible to verify that the connection was correctly produced.

According to the example shown in FIG. 2, it is may be known to connect each aluminum conductor that is realized with a copper and/or nickel coating of the bunched wires of the aluminum conductor to a contact socket 71, the socket material of which significantly differs from that of aluminum according to the may be known "electrochemical series". Such cable connections that are produced with system elements 6, 7 of different materials may ultimately be destroyed because the material decomposes due to the inevitably occurring (unavoidable) electrochemical corrosion of the (initially realized) electrically conductive connection 5. However, embodiments of cable connections may also be known (for whatever reasons), in which the thusly connected system elements 6, 7 are realized with a silver socket 141 that adds yet another different conductor material and is referred to as the fourth system element 14. The latter is arranged along the socket axis of the contact socket 71, the conically shaped socket head of which adjoins with its cone point the closed socket end (socket outlet 74) that is positioned in the center of the contact socket 71 and appropriately adapted to the conical shape.

In addition, it is amazing but true that, for example, the stripped conductor region of the aluminum conductor is positioned along the socket axis of the silver socket 141, wherein the electrically conductive connection 5 of a thusly realized arrangement is produced by circumferentially crimping the contact socket 71 on the silver socket 141, the crimping of which is transmitted to the stripped conductor region of said aluminum conductor. A few questions may remain unanswered that exceed the broader scope of the description, namely because it is not discussed, for example, whether the silver socket according to the presented arrangement of the system elements is able to delay electrochemical corrosion for a sufficiently long time; or whether the crimping pressure exerted upon the contact socket 71, for example, with a manual crimping tool may be transmitted with sufficient intensity to the aluminum conductor used as the electric conductor 61. In any case, FIG. 2 makes one thing clear: it may be impossible to make any statements that readily provide answers to such questions as: "How deep will said copper conductor be seated in the silver socket?" or "What maintainable distance will the end of the aluminum conductor have from the closed socket outlet 74 (situated approximately in the center of the contact socket 71)?" It may remain a fact that the inspection hole 75 of the contact socket 71 may obstructs the view of the aluminum conductor that remains blocked by the additional arrangement of the silver socket 141.

We hope the reader will not be disappointed because no additional embodiments are discussed that feature another duplicate silver socket 141A arranged on the socket axis of the contact socket 71 in the form of a mirror image of the aforementioned silver socket 141.

The reason for this is correlated with the repeated mentioning of the above-described disadvantages (of the same type) of a crimpable arrangement (shown on the left) of the system elements according to FIG. 2 that may occur as predicted if an additional copper conductor is connected to the socket in order to produce an electric cable connection of the conductor-fitted contact socket 71, for example, with other devices, apparatuses, etc.

These disadvantageous deficiencies of the aforementioned cable arrangements also apply to known electrically conductive connections 5 according to the examples shown in FIGS. 3A, 3B, 3C. However, certain differences may exist (in comparison with the description of the embodiment according to FIGS. 1 and 2), according to which a definitively limited insulation region of the conductor insulation 62 of an electric conductor 61 that is referred to as the first system element 6 is arranged underneath a predefined socket (crimping) surface. B of the contact socket 71 so as to prevent or at least restrict an additional admission of moisture or other liquid or gaseous fluids after the contact socket 71 has been (sufficiently?) crimped on the conductor insulation 62 inserted into the socket. The question whether this measure may suffice is not discussed further.

In a thusly crimped connection 5 that is realized, for example, with an electric conductor 61 and a contact socket 72 that both consist of an aluminum material, however, it may be impossible to visually verify that the end of the electric conductor 61 accommodated in the socket actually extends as far as the closed socket end (socket outlet 74) or was arranged such that it adjoins or is positioned a tolerable distance Δ1 from this socket end, respectively. The closure of the socket outlet 74 (i.e., the end of the socket) would be situated underneath an exemplary socket flange 76 that is annularly arranged on the circumference of the contact socket 71. Although the contact socket 71 features an inspection hole 75 (a contact hole for a visual inspection) at a defined location, this inspection hole is covered by the auxiliary socket 141 used that is realized in the form of a silver socket such that no visual inspection may be carried out in order to determine whether the electric conductor 61 is at least arranged in the socket within the permissible tolerance range. This is the reason why one utilizes correspondingly positioned markings 63 that are (circumferentially or pointwise) arranged (in a clearly visible fashion) at a defined location of the conductor insulation 62 in order to ensure the required length measure of the conductor insulation 62 and of the electric conductor 61. However, it may not be ruled out that cable connections 5 realized in accordance with the arrangements in FIGS. 3B and 3C are produced because individual or mechanical installation errors may still occur. A correctly produced embodiment of a crimped conductor-socket connection with aluminum system elements 6, 7 is illustrated in FIG. 3A. In comparison with correlating FIG. 3C, FIG. 4 provides the observer with a more detailed overview of an incorrectly produced connection 5.

The preceding (general) remarks regarding the state of the art are provided for the better understanding of the testing apparatus 1 described below (with reference to FIGS. 6-8) and the method for detecting (identifying) a contact deficiency of an (already crimped) electrically conductive connection 5 (that is implemented with this testing apparatus).

According to FIG. 6, this testing apparatus 1 consists of a measuring chamber 2, a heat radiator 9, 9R, a positioning and fixing device 18, a thermal (image) acquisition unit 11, 11R, a thermal (image) reproduction unit 13, 13R, a thermal (image) evaluation unit 15 and, if applicable, an external readout display screen 21 that are connected to one another by a circuit and/or related to one another.

The aforementioned functional elements and other means of the testing apparatus 1 according to FIG. 6, the reference symbols of which are provided with the index "R," respectively refer to a heat radiator 9R for infrared light that transfers thermal radiation 91R consisting of infrared light and, in addition, to thermal radiation 29R that consists of infrared light and is emitted by the thermal field 12R of the crimped electrically conductive connection 5 that is derived from the thermal radiation 91R for infrared light, as well as to a thermal (image) acquisition unit 11R for infrared radiation and a thermal (image) reproduction unit 13R for infrared light.

This supplementary reference symbol index "R" is also used in the following FIGS. 7 and 8 and their description.

One physical embodiment of said testing apparatus 1 is presented in FIG. 5, wherein the functional elements of the testing apparatus 1 are positioned within a chamber wall 4 for the measuring chamber 2, namely in a housing region 16 of a housing 7 that borders the latter. The thusly integrated housing 17 of the testing apparatus 1 has an appearance that corresponds or is at least very similar to that of a camera. In this case, the measuring chamber 2 features an aperture region 2A that is framed by the chamber wall 4 on one side of the measuring chamber and continued with the walls of the adjacent housing region 16.

With reference to FIG. 6 that shows a block diagram and indicates the approximate position of the circuit elements in the form of a side view, it may also be ascertained that the displaceable positioning and fixing device 18 is arranged on the bottom of the measuring chamber 2, wherein the electrically conductive connection 5 that is realized by crimping the electric connecting elements (system elements 6, 7 and/or 8) and needs to be tested for (an) existing contact deficiency (deficiencies) is fixed on said positioning and fixing device such that its vertical distance from the chamber bottom may be varied. A heat radiator 9, 9R is positioned near the chamber ceiling of the measuring chamber 2 at a certain vertical distance from the thusly positioned test arrangement (finished electrically conductive connection), wherein said test arrangement is subjected to the heat of the thermal radiation 9, 91, 91R directed thereon.

This may make it necessary to supply the heat radiator 9, 9R with energy from an energy source, for example, with the direct current IG of a d.c. generator or an accumulator, wherein said energy supply can be selectively interrupted with the aid of a first electric switch A. The thermal field acquisition panel 20 is situated within the walls of the housing region 16 near the aperture region 2A of the measuring chamber 2, wherein the thermal field acquisition panel 20 is directed toward the test arrangement (finished electrically conductive connection 5). The latter may be realized, for example, with heat sensors 19, 19R that are distributed over the panel surface and able to optically capture (record) the thermal radiation 29, 29R of a thermal field 12, 12R emitted by the conductor insulation 62 of the system elements 6 and/or 8 as well as the conducting components of the conductive (metallic) system elements 6, 7 and/or 8 due to the accumulation of the applied heat, wherein the transferred thermal radiation 29, 29R of the thermal field 12, 12R passes through the aperture region 2A of the plenum chamber 2 and may ideally be directed straight on the thermal field acquisition panel 20 or the heat sensors 19, 19R distributed to over the panel surface thereof and directly recorded.

Suitable downstream units for the signal conversion of the sensed thermal field 12, 12R are connected to the elements of the thermal field acquisition panel 20 or the heat sensors 19, respectively, and form integral components of the thermal (image) acquisition unit 11, 11R.

The thermal field 12, 12R of the test arrangement that was acquired with sensors and converted, for example, into digital signals is transmitted via an additional data line K to the thermal (image) reproduction unit 13, 13R that reproduces a digitally illustrated thermal image of the testing apparatus with possibly existing contact deficiencies of the test arrangement (the crimped electrically conductive connection 5) with the aid of an integrated thermal image reproduction panel 21B. The thermal (image) reproduction unit 13, 13R is laterally arranged on the edge and above (on the cover surface of) the housing 17 of the testing apparatus 1, wherein the thermal image reproduction panel 21B is fitted into a housing recess 21A in the cover surface of the housing 17 or positioned underneath the recess 21A. This thermal (image) reproduction unit 13, 13R or thermal image reproduction panel 21B, respectively, may also (according to this example) be arranged at any other location of the housing, for example, laterally of the housing 17. The measured values of the transferred thermal radiation of the thermal field 12, 12A that provides information, among other things, on the temperature conditions in the measuring chamber 2 during the test can also be displayed on said thermal image reproduction panel 21B.

In order to enable the thermal image reproduction panel 21B to also display other information in addition to the visual detection of a (correctly or incorrectly produced) electrically conductive connection 5 in order to visualize not only the type, but also the extent (magnitude) of a contact deficiency, a thermal (image) evaluation unit 15 may be selectively connected to said thermal (image) acquisition unit 11, 11R via data lines H, M (outgoing and incoming lines). The latter may comprise a (not-shown) storage unit, in which the digital nominal data of a thermal image that pertains to contact deficiencies is retrievably stored.

This nominal data is electronically analyzed with the actual data of the thermal field 12, 12R of the test arrangement that was acquired with the aid of sensors and digitized, namely by a comparison device that forms part of the thermal (image) evaluation unit 15, wherein the (not-shown) comparison device transmits the result obtained from the comparison via one of the data lines to the thermal (image) acquisition unit 11, 11R as shown in the example according to FIG. 6 in order to make this result available to the thermal (image) reproduction unit 13, 13R. Otherwise, the comparison device of the thermal (image) evaluation unit 15 may also directly transfer the result of the comparison between the nominal data and the actual data to the thermal (image) reproduction unit 13, 13R. This makes it possible to visually output a determined length difference $\Delta l$ that was analyzed (determined) to be a contact deficiency or a tolerated or non-existent length difference on the thermal image reproduction panel 21B or on an external readout display screen 21 connected to the thermal (image) reproduction unit 13, 13R, wherein the determined length difference a) is selected between a conductor end 64 of the conductor 61 and/or 81 that is positioned within the socket cavity 72 and along the socket axis E and the closed socket end at the socket outlet 74 or between two opposite conductor ends within the socket cavity 72 and/or b) refers to the detection of an insulated conductor region accommodated in the socket that is covered with insulation 62 and assigned to a socket (crimping) surface B for crimping the insulation that is positioned within the contact socket 71 along the socket axis F and situated near the socket inlet 78.

Figure 7:
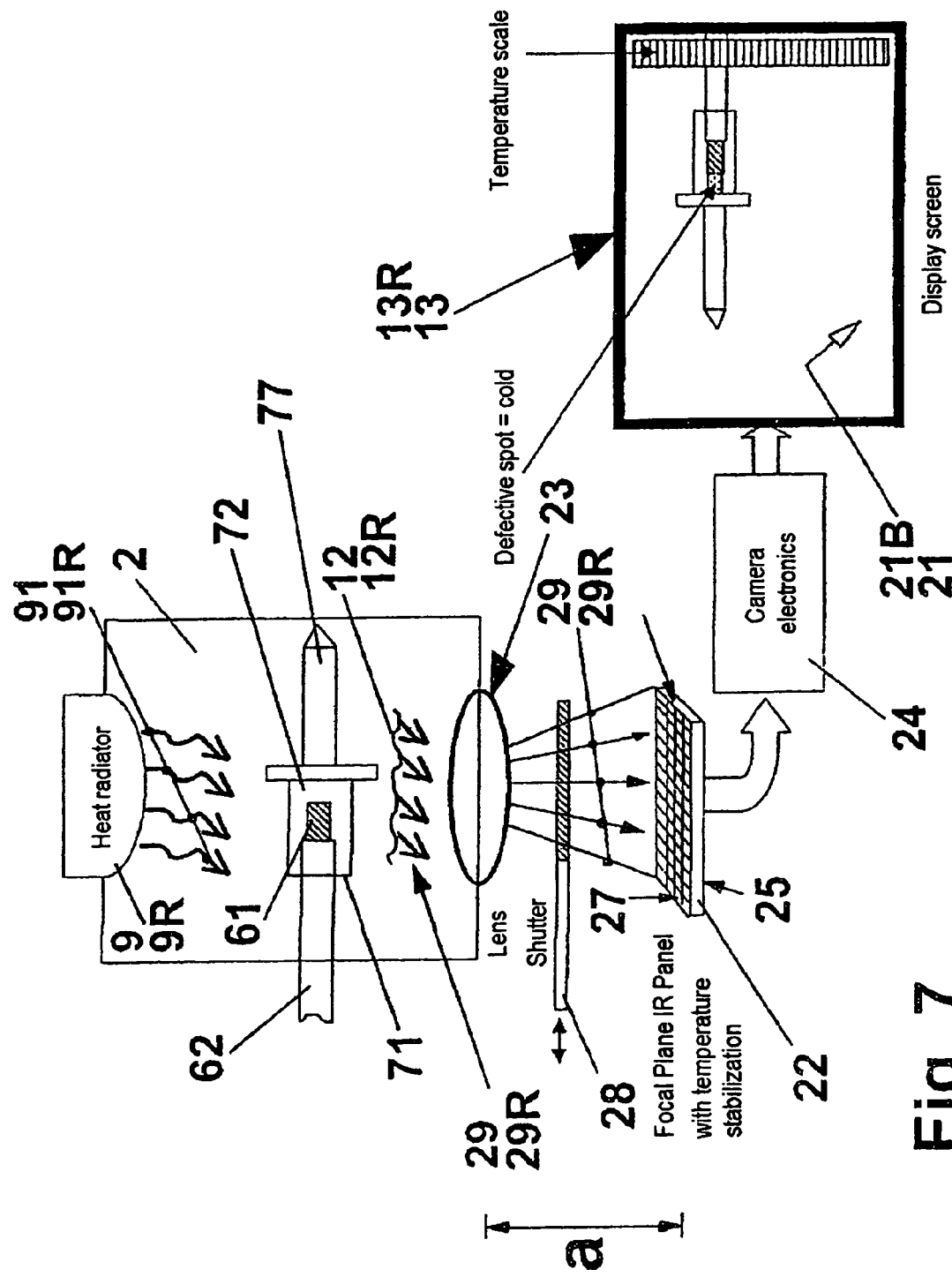
FIG. 7, shows an embodiment of the testing apparatus according to FIG. 5, and FIG. 8, shows a modified embodiment of the testing apparatus according to FIG. 5.
Figure 8:
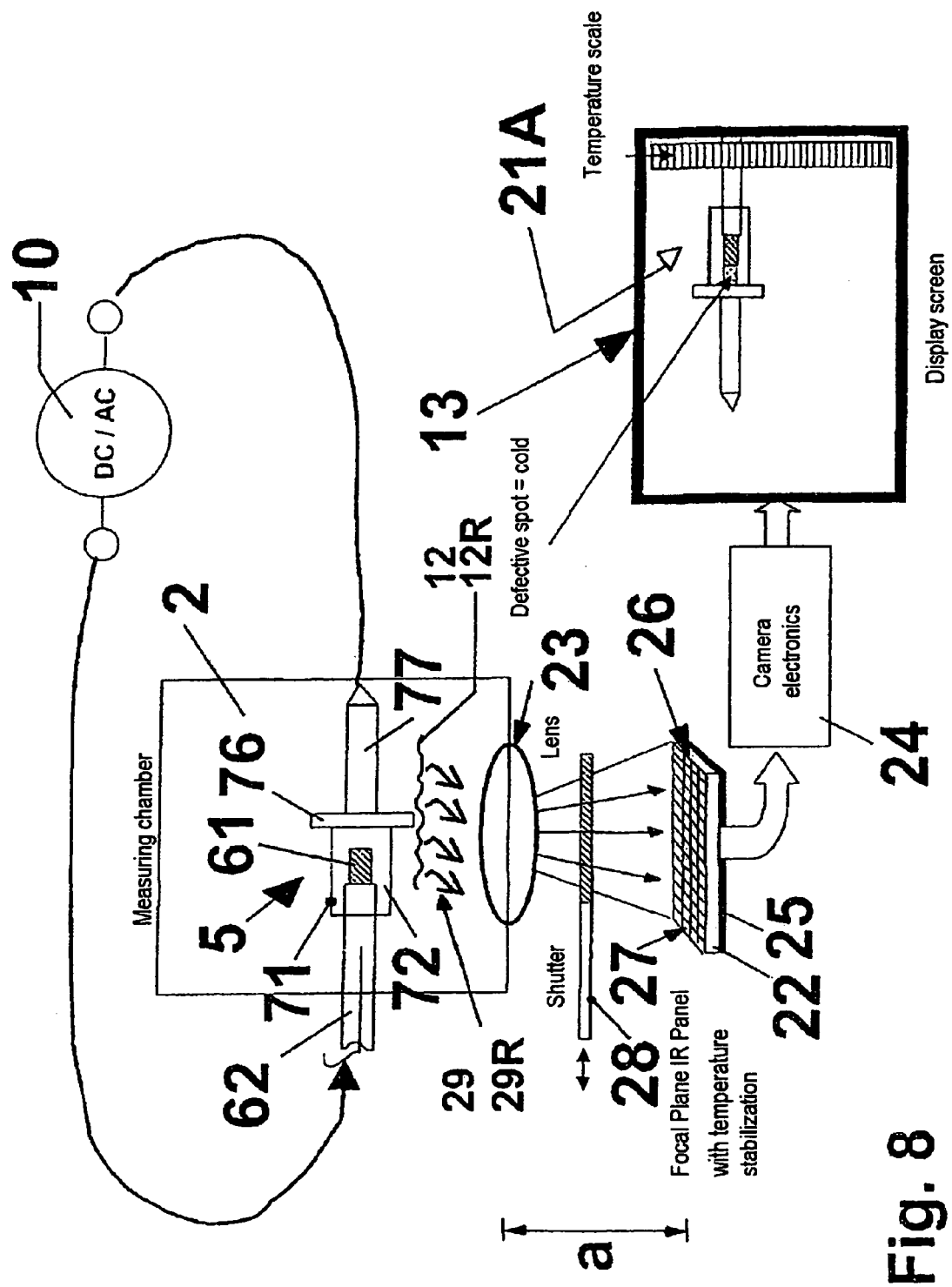

FIGS. 7 and 8 respectively show an embodiment of the testing apparatus 1 with a measuring chamber 2 according to FIG. 6 and a not shown adjacent housing region 16 that is protected by walls and forms a complete housing 17 together with the measuring chamber. One may ascertain from the illustration in FIG. 7 that the heat radiator 9, 9R operated according to the example shown in FIG. 6 emits thermal radiation 9, 9R in the direction of the test arrangement [electric conductor 61, conductor insulation 62, contact socket 71 with illustrated socket cavity 72, as well as socket flange 76 arranged in the center of the socket and (plug-type) socket extension 77 along the socket axis F attached to the latter (to the right of the contact socket 71)], wherein this thermal radiation heats the test arrangement and builds up a thermal field 12, 12R that is optically captured by an optical device 23 in the form of a lens and directed on a plane plate 22, the surface of which is formed by two-dimensionally distributed heat sensors 27, with the aid of an opened optical shutter device 28 that is released during the measuring phase and remains closed during the heating phase of the test arrangement. If the times for the opening and closing function of the shutter device 28 are not observed, the function of the sensor-fitted plate 22 would be jeopardized because it cannot be precluded that this plate is heated up (despite planned temperature stabilization) such that the measuring sensitivity may be respectively diminished or impaired, comprised image data may be converted and faulty images may be produced. Corresponding panel elements 25 for the temperature stabilization are two-dimensionally distributed underneath the plate 22 such that a "Focal Plane IR Panel with temperature stabilization" is formed.

An electronics unit 24 arranged downstream of the heat sensors 27 is also referred to as the "camera electronics" and completes the functions of a thermal (image) acquisition unit 11, 11 R that is already known from the description of FIG. 6. In addition, the distance a assumed between the lens and the plate 22 is shown. These figures also show the connection between said electronics unit 24 and the thermal (image) reproduction unit 13, 13R, on the thermal image reproduction panel 21B of which a readout display screen 21 with a graphic illustration is reproduced that pertains to an incorrectly produced electrically conductive connection 5 according to the example shown in FIGS. 3C and 4.

In contrast to the embodiment according to FIG. 7, the embodiment shown in FIG. 8 is designed for electrically heating the test arrangement described with reference to FIG. 7 by means of an energy source (d.c./a.c.) such that the installation of a heat radiator 9, 9R may not be required. All other functions of the test arrangement 1 described with reference to FIG. 7 are equally realized.

The presented testing apparatus 1 and the correlating method for detecting a contact deficiency of an electrically conductive connection 5 may be summarized in a simplified fashion as follows.

An electric conductor 61 that is incorrectly inserted into the contact socket 71 results in an air gap $\Delta l$ between the conductor end situated within the socket cavity 72 and the contact socket. This air gap $\Delta l$ has an inferior coefficient of thermal conductivity in comparison with the metallic components of the electrically conductive connection 5 (electric conductor 61, contact socket 71) that are connected by crimping. Due to the heating of the crimp connection, thermography makes it possible to visualize whether an unacceptable air gap $\Delta l$ is present that would result in inferior contacting of the connection 5. In addition, the converted deficiency image according to FIGS. 6-8 may make it possible to deduce that a crimp of the conductor insulation (an insulation crimp) that is realized, for example, according to FIG. 3B has an insufficient crimpable surface and therefore tends to develop the described leaks of the electrically conductive connection 5 that are associated with the risk of undesirable corrosion, for example, due to the admission of atmospheric humidity or other corrosive gaseous pollutants into the socket cavity 72.

According to the example shown in FIG. 7, the following test steps of a simplified method for detecting contact deficiencies of a cable connection may be carried out in the described sequence, wherein a) the crimp connection 5 (electric conductor 61 with contact socket 71) is fixed in a measuring chamber 2;

b) the cable connection 5 is then heated to a certain-temperature by a heat radiator 9;

c) the heating of the connection 5 is subsequently shut off after the metallic components of the electrically conductive connection 5 have reached the temperature t;

d) the optical shutter device 28 is then opened;

e) a thermal image is recorded by means of a so-called IR array;

f) the signal information of the IR array is subsequently converted in an electronics unit 24 (in the camera electronics), and g) the thermal image is ultimately displayed on a thermal image reproduction panel 21B (a screen).

With respect to the above-described method for detecting contact deficiencies of a cable connection, the test step described below may be substituted—referred to the illustration shown in FIG. 8—for step b) as follows h) the cable connection 5 with a generator-fed energy source 10 connected thereto is then supplied with a current and heated to a certain temperature.

| | List of Reference Symbols |
|---|---|
| 1 | Testing apparatus |
| 2 | Measuring chamber |
| 2A | Lateral aperture region |
| 3 | Aperture region (of measuring chamber 2) |
| 4 | Chamber wall (of measuring chamber 2) |
| 5 | Electrically conductive connection |
| 6 | First system element |
| 61 | Electric conductor |
| 62 | Conductor insulation |
| 63 | Marking (of conductor insulation 62) |
| 7 | Second system element |
| 71 | Contact socket |
| 71A | Contact socket |
| 72 | Socket cavity |
| 72A | Socket cavity |
| 73 | Socket wall |
| 74 | Closed socket outlet (socket end) |
| 75 | Inspection hole (of contact socket 71) |
| 76 | Socket flange |
| 77 | Socket extension, plug-type |
| 78 | Socket inlet |
| 78A | Socket inlet |
| 8 | Third system element |
| 81 | Electric conductor |
| 9 | Heat radiator |
| 9R | Infrared light heat radiator |
| 91 | Transferred thermal radiation |
| 91R | Transferred thermal radiation--consisting of transferred infrared light |
| 10 | Energy source; generator; d.c. generator |
| 11 | Thermal (image) acquisition unit |
| 11R | Thermal image acquisition unit for infrared light |
| 12 | Thermal field |
| 12R | Thermal field--derived from thermal radiation for infrared light |
| 13 | Thermal (image) reproduction unit |
| 13R | Thermal (image) reproduction unit for infrared light |
| 14 | Fourth system element |
| 141 | Auxiliary socket; silver socket |
| 14A | Duplicate of fourth system element 14 |
| 141A | Duplicate of auxiliary socket 141; silver socket |
| 15 | Thermal (image) evaluation unit |
| 16 | Housing region (of housing 17) protected by walls |
| 17 | Housing (of testing apparatus 1) |
| 18 | Positioning and fixing device |
| 19 | Heat sensors |
| 20 | Thermal field acquisition panel |
| 21 | Readout display screen |
| 21A | Housing recess |
| 21B | Thermal image reproduction panel |
| 22 | Plate, plane |
| 23 | Optical device; lens |
| 24 | Electronics unit |
| 25 | Panel element, temperature-stabilized |
| 26 | Heat sensor array |
| 27 | Heat sensors |
| 28 | Optical shutter device |
| 29 | Thermal radiation |
| 29R | Thermal radiation |
| A, D | Switch |
| B | Socket (crimping) surface for insulation crimp |
| C | Conductor end region (of conductor 61, 81) |
| F | Socket axis |
| G | Index: generator |
| H, M | Data line |
| I | Electric current, constant |
| K | Data line |
| S | Air gap |
| a | Distance (plate 22-optical device 23) |
| b | (Pre)defined length [of socket (crimping) surface B] |
| l | Stretched element length (of the system elements 6-8 in the measuring chamber 2) |
| $l_{ISO}$ | Required insulation length (of conductor insulation 62) |

The invention claimed is:

1. A testing apparatus for detecting a contact deficiency of an electrically conductive connection comprising a plurality of electrically conductive system elements having insulated and metallic components for conducting signals or energy, the testing apparatus comprising:
   a measuring chamber;
   a heat radiator;
   a thermal (image) acquisition unit; and
   a thermal (image) reproduction unit;
   wherein in the measuring chamber the system components of the electrically conductive connection are positioned,
   wherein the system components are connected to one another in an electrically conductive fashion;
   wherein the heat radiator is capable of being supplied with energy;
   wherein the transferred thermal radiation of the heat radiator can be emitted into the measuring chamber and the thermal radiation can be directed toward the region of the system elements, such that a thermal field of the insulated and the metallic system components of these connected system elements is generated,
   wherein the thermal (image) acquisition unit is adapted for optically capturing the generated thermal field emitted by the heated insulated and metallic system components of said connected system elements and for realizing a signal conversion into a thermal image of the connected system elements;
   wherein the thermal (image) reproduction unit is adapted for realizing a visual reproduction of the converted thermal image; and
   wherein the thermal (image) acquisition unit and the thermal (image) reproduction unit are connected in an information technological manner.

2. A testing apparatus for detecting a contact deficiency of an electrically conductive connection comprising a plurality of electrically conductive system elements having insulated and metallic components for conducting signals or energy, wherein the testing apparatus comprises:
   a measuring chamber;
   a heat radiator;
   a thermal (image) acquisition unit; and
   a thermal (image) reproduction unit;
   wherein in the measuring chamber the system components of the connection are positioned;
   wherein the system components are connected to one another in an electrically conductive fashion;
   wherein the heat radiator for infrared light can be supplied with a constant current by a generator;
   wherein the infrared light thermal radiation of said heat radiator can be transferred transversely or horizontally or vertically or in a deflected fashion and directed toward the region of the electrically conductive connection, such that a thermal field of the insulated and metallic system components of these connected system elements can be generated by the infrared light thermal radiation;
   wherein the thermal (image) acquisition unit for infrared light is adapted for optically capturing the generated thermal field;
   wherein the thermal (image) acquisition unit is adapted for realizing a signal conversion into an infrared light thermal image of the conductively connected system elements emitted by the heated insulated and metallic system components of these connected system elements;
   wherein the thermal (image) reproduction unit for infrared light is adapted for realizing a visual reproduction of a digitally converted thermal image; and wherein the thermal (image) acquisition unit and the thermal (image) reproduction unit are connected in an information technological manner.

3. The testing apparatus of claim 1 for use in the testing of prefabricated cable connections installed in aircraft comprising at least two electrically conductive system elements that are positioned within the measuring chamber, wherein the first system element comprises an insulated electric conductor of an installation cable that is used as an aluminum conductor and a second system element comprises a rigid metallic contact socket of an aluminum material or an aluminum alloy, the socket wall of which encloses a socket cavity that is closed at the socket outlet on the outlet side of the socket cavity, wherein the electric conductor, the conductor insulation of which is positioned on the inlet side of the socket cavity underneath a socket (crimping) surface that is arranged on the circumference of the socket and limited near the socket inlet when it is inserted therein, is arranged within the socket cavity with a stripped conductor end region that forms an extension of the conductor insulation, and wherein the contact socket is mechanically fixed on the conductor insulation by crimping the socket (crimping) surface of the socket wall and the stripped conductor end region is connected to the contact socket in an electrically conductive fashion due to the crimping of the socket wall.

4. The testing apparatus of claim 2 for use in the testing of prefabricated cable connections installed in aircraft comprising at least three electrically conductive system elements that are positioned within the measuring chamber, wherein the cable connection comprises a first and/or a third system element that is respectively realized with an insulated electric conductor of an installation cable used as an aluminum conductor, as well as a second system element that is realized with a rigid metallic contact socket of an aluminum material or an aluminum alloy, wherein the respective electric conductor, the conductor insulation of which is positioned on the inlet side of the socket cavity underneath a socket (crimping) surface that is arranged on the circumference of the socket and limited near the socket inlet when it is inserted therein, is arranged within the socket cavity with a stripped conductor end region that forms an extension of the conductor insulation, and wherein the contact socket is mechanically fixed on the conductor insulation by crimping the socket (crimping) surface of the socket wall and the stripped conductor end region is connected to the contact socket in an electrically conductive fashion due to the crimping of the socket wall.

5. The testing apparatus of claim 1, wherein the thermal (image) acquisition unit for detecting contact deficiencies that indicate an incorrectly produced conductive connection is connected to a thermal (image) evaluation unit with respect to information technology, and wherein the thermal (image) evaluation mark can be selectively connected to the thermal (image) acquisition unit in order to determine deviations between nominal data and actual data of the conductive connection and to realize the conversion of these deviations that predominantly pertain to contact deficiencies detected by determining a length difference ($\Delta l$) between a conductor end of the conductor that is positioned within the socket cavity and along a socket axis and a closed socket end at the socket outlet or between two opposite conductor ends within the socket cavity and/or by detecting an insulated conductor region accommodated in the socket that is covered with a conductor insulation and assigned to a socket (crimping) surface for the insulation crimp that is situated within the contact socket along the socket axis and positioned near the socket inlet.

6. The testing apparatus of claim 1, wherein an aperture region that can be tightly sealed relative to escaping radiation is arranged in a chamber wall of the measuring chamber, and wherein the electrically connected system elements can be inserted through the aperture region.

7. The testing apparatus of claim 6, wherein the chamber wall contains at least one aperture region.

8. The testing apparatus of claim 6, wherein the thermal (image) acquisition unit, the thermal (image) reproduction unit, the thermal (image) evaluation unit and the heat radiator are positioned within a housing region that is protected by walls and extended by the chamber wall of the measuring chamber.

9. The testing apparatus of claim 6, wherein the chamber wall and the housing region protected by walls form integral components of a housing of the testing apparatus that is protected against escaping radiation.

10. The testing apparatus of claim 8, wherein the measuring chamber is arranged upstream of the thermal (image) acquisition unit.

11. The testing apparatus of claim 1, wherein a positioning and fixing device is arranged within the measuring chamber such that it can be displaced horizontally or vertically or transversely, with said positioning and fixing device making it possible to fix and change the position in space of the electrically connected system elements.

12. The testing apparatus of claim 1, wherein the thermal (image) acquisition unit is equipped with a plurality of two-dimensionally distributed optical heat sensors or with a thermal field acquisition panel that are functionally able to capture the transferred thermal radiation and connected to downstream units for the signal conversion of the thermal field.

13. The testing apparatus of claim 1, wherein the thermal (image) reproduction unit and the thermal (image) evaluation unit are respectively connected to a data line that is connected with respect to information technology to an additional data line connected to the thermal (image) acquisition unit.

14. The testing apparatus of claim 1, wherein the thermal (image) acquisition unit and the thermal (image) reproduction unit or the thermal (image) acquisition unit and the thermal (image) evaluation unit and the thermal (image) reproduction unit are connected with respect to information technology.

15. The testing apparatus of claim 1, wherein the heat radiator is realized in the form of an infrared radiator and serves for realizing the radiant infrared light heating of the connected system elements by means of the infrared radiation transferred by the infrared radiator.

16. The testing apparatus of claim 1, wherein the heat radiator is realized in the form of a halogen radiator for radiant heating of the connected system elements by means of the thermal radiation transferred by the halogen radiator.

17. The testing apparatus of claim 1,
wherein the thermal (image) acquisition unit and the thermal (image) reproduction unit and the thermal (image) evaluation unit are embodied in an infrared light camera.

18. The testing apparatus of claim 1,
wherein the thermal (image) acquisition unit and/or the thermal (image) reproduction unit and/or the thermal (image) evaluation unit comprises a peripheral device.

19. The testing apparatus of claim 1,
wherein the thermal (image) reproduction unit is equipped with a thermal image reproduction panel that is arranged underneath or within a recess in the housing of the testing apparatus.

20. The testing apparatus of claim 19,
wherein a data line connected to the thermal (image) acquisition unit and the thermal (image) reproduction unit by a second switch serves for connecting at least one peripheral device, preferably a readout display screen for illustrating the thermal image.

21. The testing apparatus of claim 1,
wherein the thermal (image) acquisition unit comprises a plane plate that is used as the focal plane for an optical device, the optical device and an electronics unit,
wherein a temperature-stabilized panel element is fixed on the plate in a plane fashion underneath the focal plane,
wherein an infrared light sensor array, composed of comprising a plurality of infrared light sensors, is integrated into the plate in such a way that a plate surface that is arranged at a distance from said optical device and directed toward the measuring chamber is suitable for producing a surface-distributed sensitive recording of the thermal field generated by the thermal radiation transferred by the latter, and
wherein the heat sensors of the plate are connectable to the electronics unit that supplies the thermal image supply unit with respect to information technology after the signal conversion of the sensitively acquired thermal radiation has been performed.

22. The testing apparatus of claim 21,
wherein an optical shutter device is arranged between the optical device and the plane plate for interruption of the radiation path of the transferred thermal radiation.

23. A method for detecting a contact deficiency of an electrically conductive connection that is adapted for the testing of electrically conductive system elements used for conducting signals or energy;
wherein a plurality of serially connected system elements are connected in an electrically conductive fashion by a crimp connection at the connecting points of the system elements;
wherein the method utilizes a testing apparatus, the functional scope of which comprises a measuring chamber, a heat radiator that is supplied with energy and arranged within the latter, a thermal (image) acquisition unit and a thermal (image) reproduction unit that are connected in an information technological manner; and
wherein the method comprises:
a) positioning the system elements that are serially connected by crimp connections in the measuring chamber;
b) transferring thermal radiation toward the region of the system elements in the measuring chamber by the heat radiator;
c) transferring thermal energy of the thermal radiation to insulated and metallic system components of the connected system elements such that a thermal field is generated;
d) optically capturing the thermal (image) acquisition unit and subsequently converting the generated thermal field by a signal conversion into a thermal image; and
e) displaying a visual reproduction of the converted thermal image by the thermal (image) production unit.

24. The method of claim 23,
wherein the metallic system components of the connected system elements are, with the exception of step b), heated by current heating, and
wherein the current heating of the connected system elements is realized with a controllable energy source that is connected to the serially connected system elements and forms a circuit.

25. The method of claim 23,
wherein the thermal (image) acquisition unit is connected to a thermal (image) evaluation unit after step d) in a step f) subsequent to step c),
wherein the thermal (image) evaluation unit can be selectively connected to the thermal (image) acquisition unit and serves for detecting and, if so required, transmitting all contact deficiencies indicating an incorrectly produced electrically conductive connection to the thermal (image) acquisition unit before the signal conversion into a thermal image is carried out.

26. The method of claim 25,
wherein the contact deficiencies according to step f) are detected by determining the deviations between nominal data and actual data of the produced electrically conductive connection in the form of a comparison between a nominal value based on a correctly produced connection that is stored in an internal storage unit of the thermal (image) evaluation unit and an actual value based on an incorrectly produced connection that is obtained by the thermal (image) acquisition unit with the thermal image signal conversion data of these serially connected system elements and retrievably transmitted to the thermal (image) evaluation unit.

27. The method of claim 26,
wherein the stored nominal value of an incorrectly produced electrically conductive connection and its obtained actual value
g) are related to a permissible deviation of a length difference ($\Delta l$) between a conductor end of a conductor that is situated within a socket cavity and positioned along the socket axis and a closed socket end [at the socket outlet] or between two opposite conductor ends within the socket cavity and/or
h) related to a required insulation length of a section of a conductor insulation that is used as a socket (crimping) surface and assigned to an insulated conductor region accommodated in the socket that is situated within the socket cavity of the contact socket along the socket axis and correlated with an insulation-backed socket region extending as far as the vicinity of the socket inlet.

\* \* \* \* \*

UNITED STATES PATENT AND TRADEMARK OFFICE
CERTIFICATE OF CORRECTION

| | | |
|---|---|---|
| PATENT NO. | : 7,688,084 B2 | Page 1 of 1 |
| APPLICATION NO. | : 12/308159 | |
| DATED | : March 30, 2010 | |
| INVENTOR(S) | : Wolfgang Erdmann and Eckehard Zündorf | |

It is certified that error appears in the above-identified patent and that said Letters Patent is hereby corrected as shown below:

On the Title Pg, Item (75) Inventors: "Zuendorf" should read --Zündorf--

On the Title Pg, Item (73) Assignee: "Deustschland" should read --Deutschland--

Col. 1, Line 35, delete "to" before "strip conductor"

Col. 4, Line 9, "absorbs" should read --absorb--

Col. 5, Line 10, insert --a-- after "systems"

Col. 5, Line 53, delete "is" after "it"

Col. 6, Line 2, insert -- - -- between "conically shaped"

Col. 6, Line 30, "obstructs" should read --obstruct--

Col. 6, Line 54, delete "." after "surface"

Col. 14, Line 42, "are" should read --is--

Col. 14, Line 43, insert --is-- after "and"

Col. 15, Line 26, delete "composed of"

Signed and Sealed this

Twenty-second Day of March, 2011

David J. Kappos
*Director of the United States Patent and Trademark Office*